(12) United States Patent
Kang et al.

(10) Patent No.: US 9,316,776 B2
(45) Date of Patent: Apr. 19, 2016

(54) LIGHT SOURCE ASSEMBLY INCLUDING HEXAHEDRON-SHAPED LIGHT SOURCE, DISPLAY APPARATUS INCLUDING THE SAME, AND METHOD OF MANUFACTURING THE SAME

(71) Applicant: Samsung Display Co., Ltd., Yongin (KR)

(72) Inventors: Seok-Won Kang, Yongin-si (KR); Sang-Chul Byun, Anyang-si (KR); Dong-Yeon Kang, Seoul (KR); Seok-Hyun Nam, Seoul (KR); Sang-Hyuk Lee, Anyang-si (KR); Hyoung-Joo Kim, Anyang-si (KR); Ji-Eun Nam, Seoul (KR); Ju-Young Yoon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 87 days.

(21) Appl. No.: 14/066,249

(22) Filed: Oct. 29, 2013

(65) Prior Publication Data

US 2015/0003107 A1    Jan. 1, 2015

(30) Foreign Application Priority Data

Jun. 26, 2013  (KR) .......................... 10-2013-0073590

(51) Int. Cl.
*H01L 33/58*  (2010.01)
*F21V 8/00*  (2006.01)
*H01L 33/60*  (2010.01)
*G02F 1/1335*  (2006.01)
*H01L 33/48*  (2010.01)
*H01L 33/50*  (2010.01)

(52) U.S. Cl.
CPC .............. *G02B 6/0011* (2013.01); *G02B 6/003* (2013.01); *G02B 6/0031* (2013.01); *G02B 6/0068* (2013.01); *G02B 6/0073* (2013.01); *H01L 33/60* (2013.01); *G02F 1/133615* (2013.01); *H01L 33/486* (2013.01); *H01L 33/50* (2013.01)

(58) Field of Classification Search
CPC .. G02B 6/0011; G02B 6/0068; G02B 6/0031; G02B 6/0073; G02B 6/003; H01L 33/60
See application file for complete search history.

(56) References Cited

U.S. PATENT DOCUMENTS

| | | | |
|---|---|---|---|
| 7,338,823 | B2 | 3/2008 | Han et al. |
| 8,217,413 | B2 | 7/2012 | Park |
| 8,269,224 | B2 | 9/2012 | Park |
| 2008/0123021 | A1 | 5/2008 | Park et al. |
| 2012/0287355 | A1 | 11/2012 | Oya |
| 2012/0293721 | A1 | 11/2012 | Ueyama |

(Continued)

FOREIGN PATENT DOCUMENTS

| | | |
|---|---|---|
| JP | 2006-310887 | 11/2006 |
| JP | 2008-071696 | 3/2008 |

(Continued)

*Primary Examiner* — Joseph L Williams
(74) *Attorney, Agent, or Firm* — H.C. Park & Associates, PLC

(57) ABSTRACT

A light source assembly includes a base substrate, a resin layer disposed on the base substrate, and exposing a portion of the base substrate, and a first light source disposed on the portion of the base substrate which is exposed by the resin layer. The first light source has a hexahedron shape. The first light source has a face in parallel with the base substrate and having a height smaller than length or width of the face.

20 Claims, 14 Drawing Sheets

(56) References Cited

U.S. PATENT DOCUMENTS

2013/0010496 A1    1/2013    Higashi et al.
2013/0051069 A1    2/2013    Moon et al.

FOREIGN PATENT DOCUMENTS

| | | |
|---|---|---|
| JP | 2008-130909 | 6/2008 |
| JP | 2008-270786 | 11/2008 |
| KR | 10-0764455 | 10/2007 |
| KR | 10-2009-0043799 | 5/2009 |
| KR | 10-2009-0050224 | 5/2009 |
| KR | 10-2009-0099785 | 9/2009 |
| KR | 10-2011-0024270 | 3/2011 |
| KR | 10-2011-0026733 | 3/2011 |
| KR | 10-2011-0071852 | 6/2011 |
| KR | 10-1045415 | 6/2011 |
| KR | 10-2011-0099449 | 9/2011 |
| KR | 10-2011-0107519 | 10/2011 |
| KR | 10-2011-0112956 | 10/2011 |
| KR | 10-1078031 | 10/2011 |
| KR | 10-2011-0135703 | 12/2011 |
| KR | 10-2012-0006876 | 1/2012 |
| KR | 10-2012-0010070 | 2/2012 |
| KR | 10-2012-0044812 | 5/2012 |
| KR | 10-2012-0124827 | 11/2012 |
| KR | 10-2012-0135654 | 12/2012 |

LIGHT SOURCE ASSEMBLY INCLUDING HEXAHEDRON-SHAPED LIGHT SOURCE, DISPLAY APPARATUS INCLUDING THE SAME, AND METHOD OF MANUFACTURING THE SAME

This application claims priority to Korean Patent Application No. 10-2013-0073590, filed on Jun. 26, 2013, which is hereby incorporated by reference for all purposes as if fully set forth herein.

BACKGROUND

1. Field

Exemplary embodiments of the invention relate to a light source assembly, a display apparatus having the light source assembly and a method of manufacturing the light source assembly.

More particularly, exemplary embodiments of the present invention relate to a light source assembly for a liquid crystal display apparatus, a display apparatus having the light source assembly and a method of manufacturing the light source assembly.

2. Description of the Background

Generally, a liquid crystal display (LCD) apparatus has various advantageous characteristics such as a mobility and a durability attributable to thin thickness, lightweight, and low power consumption. Thus, the LCD apparatus has been widely used in various applications such as a monitor, a note personal computer, and mobile devices (e.g., a cellular phone. The LCD apparatus may include an LCD panel for displaying an image by using an optical transmissivity of liquid crystal and a backlight assembly disposed under the LCD panel to provide light to the LCD panel. The backlight assembly may include a light source assembly for generating light and a light guiding plate for guiding the light to the LCD panel.

Recently, due to meet the convenience of mobility, thinner LCD apparatuses have been adopted, thus the thickness of the backlight assembly has been challenged to be thinner. However, if the light source assembly of the backlight assembly is thin, size of a light emitting diode (LED) chip should also be thin, leading to decreased light efficiency.

SUMMARY

Exemplary embodiments of the invention provide a light source assembly capable of improving a light efficiency while decreasing a thickness of a backlight assembly.

Additional features of the invention will be set forth in the description which follows, and in part will be apparent from the description, or may be learned by practice of the invention.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

Exemplary embodiments of the present invention disclose a light source assembly. The assembly includes a base substrate. The assembly includes a resin layer disposed on the base substrate without completely covering the base substrate such that a portion of the base substrate is exposed. The assembly also includes a first light source disposed on the exposed portion, the first light source including a hexahedron shape, and the first light source including a smaller height than a length or a width of a face of the first light source disposed parallel with the base substrate.

Exemplary embodiments of the present invention disclose a display apparatus. The apparatus includes a display panel. The apparatus includes a light source assembly. The light source assembly includes a base substrate. The light source assembly includes a resin layer disposed on the base substrate without completely covering the base substrate such that a portion of the base substrate is exposed. The light source assembly includes a first light source disposed on the exposed portion, the first light source including a hexahedron shape, and the first light source including a smaller height than a length or a width of a face of the first light source disposed parallel with the base substrate. The apparatus includes a light guiding plate configured to guide light from the light source assembly to the display panel. The apparatus also includes a receiving container configured to receive the display panel, the light source assembly and the light guiding plate.

Exemplary embodiments of the present invention disclose a method. The method includes forming a base substrate. The method includes forming a resin layer on the base substrate to expose a portion of the base substrate. The method includes disposing a first light source including a face in parallel with the base substrate on the exposed portion, the first light source including a hexahedron shape, and a height smaller than a length or a width of the face. The method includes forming a fluorescence layer on the first light source. The method includes forming a transparent layer on the base substrate on which the fluorescence layer is formed. The method also includes forming a reflective layer on the transparent layer, the reflective layer comprising a material having relatively high light reflectance.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

A light source assembly and a method of manufacturing a light source assembly are disclosed. In the following description, for the purposes of explanation, numerous specific details are set forth in order to provide a thorough understanding of the present invention. It is apparent, however, to one skilled in the art that the present invention may be practiced without these specific details or with an equivalent arrangement. In other instances, well-known structures and devices are shown in block diagram form in order to avoid unnecessarily obscuring the present invention.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 1:
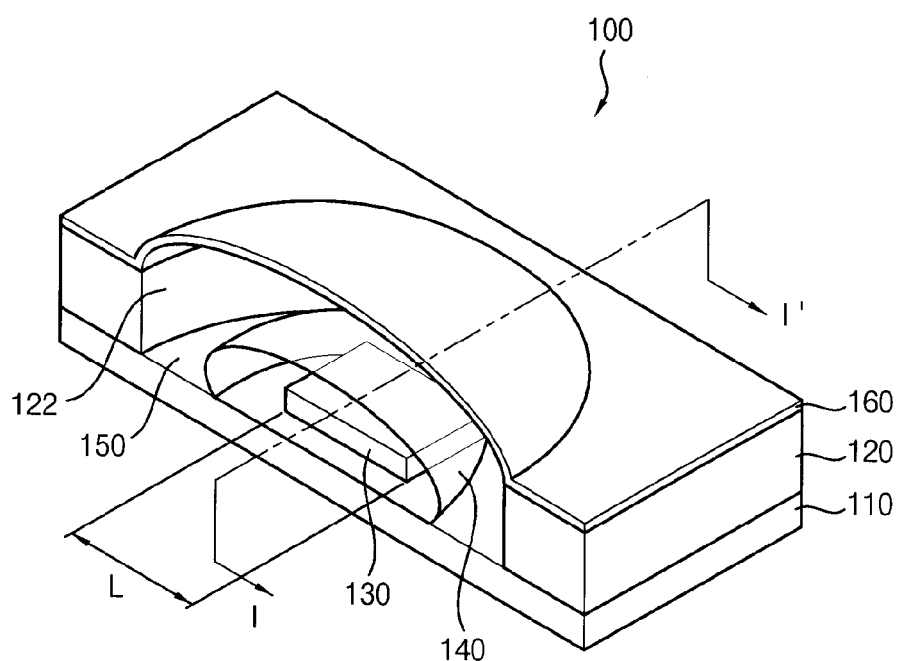
FIG. 1 is a perspective view illustrating a light source assembly according to exemplary embodiments of the invention.
Figure 2:
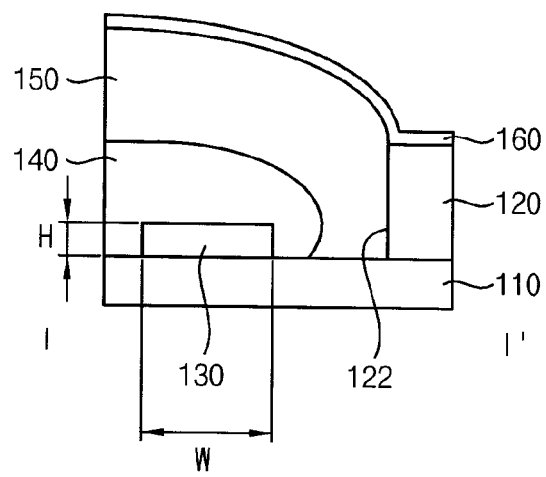
FIG. 2 is a cross-sectional view of the light source assembly taken along a line I-I' of FIG. 1.

FIG. 1 is a perspective view illustrating a light source assembly according to exemplary embodiments of the invention. FIG. 2 is a cross-sectional view of the light source assembly taken along a line I-I' of FIG. 1.

Referring to FIGS. 1 and 2, for example, a light source assembly 100 may include a base substrate 110, a resin layer 120, a light source 130, a fluorescence layer 140, a transparent layer 150 and a reflective layer 160.

The base substrate 110 may be an insulating substrate or a flexible printed circuit board. The base substrate 110 may include a metal pattern (not shown) disposed on the base substrate 110 to drive the light source 130. For example, the base substrate 110 may include polyimide resin, and a copper wiring on the base substrate 110 to drive the light source 130. In addition, the base substrate 110 may have a thickness of about 0.13 mm.

The resin layer 120 is disposed on the base substrate 110, and may include a curved side surface 122 partially surrounding the light source 130. For example, the resin layer 120 may include at least one of a polyphthalamide resin (PPA) and a polycyclomethyleneterephthalate resin (PCT). The resin layer 120 is formed on the base substrate 110 expect for where the light source 130 is disposed. Thus, the curved side surface 122 surrounds sides of the light source 130 except for a light exiting surface which light from the light source 130 exits. The resin layer 120 may include an opaque material to reflect the light from the light source 130.

The light source 130 is disposed on the base substrate 110, and electrically connected to the metal pattern formed on the base substrate 110. The light source 130 generates light. The light source 130 may be a light emitting diode (LED) chip. The light source 130 may be a LED chip having a size bigger than about 270*700 (width*length)μm. For example, the light source 130 may be an LED chip having a size about 500*500 μm to about 1000*1000 μm. In an exemplary embodiment, the light source 130 may be an LED chip having a size about 500*1000 μm. A face formed by width*length of the light source is in parallel with the base substrate 110. The light source 130 may have a height H smaller than the width W and the length L.

The fluorescence layer 140 is disposed on the light source 130 to cover the light source 130. The fluorescence layer 140 may include a phosphor to improve a light efficiency of the light source 130. When the light source 130 is a blue LED chip, the fluorescence layer 140 may include a yellow phosphor. For example, the fluorescence layer 140 may include a YAG:Ce($T_3A_{15}O_{12}$:Ce) type phosphor such as a yttrium aluminum garnet doped with cerium or a silicate type yellow phosphor having a dominant wavelength of about 530~570 nm.

The transparent layer 150 is formed on the fluorescence layer 140 to fill a space formed by the curved side surface 122 of the resin layer 120 and the base substrate 110. For example, the transparent layer 150 may be formed of a transparent silicon. The transparent layer 150 may have a height greater than that of the resin layer 120, and may form a dome shape surrounded by the light source 130. Thus, the light from the light source 130 may effectively exit through the light exit surface by the reflective layer 160 on the transparent layer 150, so that the light efficiency may be improved. The transparent layer 150 may have a height about 0.27 mm from an upper surface of the base substrate 110.

The reflective layer 160 is disposed on the transparent layer 150 and the resin layer 120 to cover the transparent layer 150. The reflective layer 160 may include a material having relatively high light reflectance. Thus, the light from the light source 130 reflects on the reflective layer 160 through the fluorescence layer 140 and the transparent layer 150, and efficiently exits through the light exiting surface. Thus, the light efficiency may be improved.

In the exemplary embodiments, the light source assembly 100 may have a height of about 0.3 mm. Thus, the light source assembly 100 may have a relatively small height, and have a relatively large LED chips as a light source, so that the light efficiency may be improved.

Figure 3:
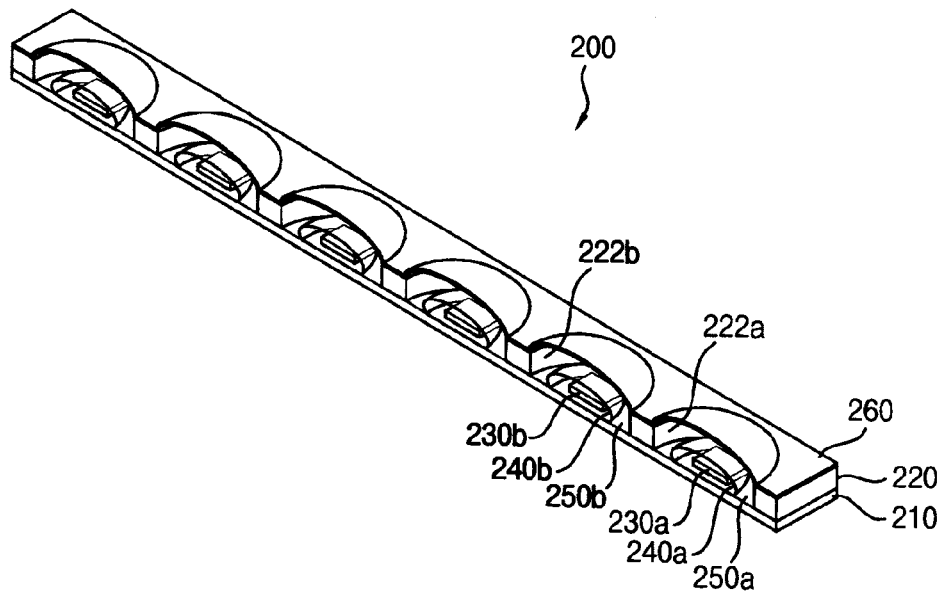
FIG. 3 is a perspective view illustrating a light source assembly according to exemplary embodiments of the invention.

FIG. 3 is a perspective view illustrating a light source assembly according to exemplary embodiments of the invention.

Referring to FIG. 3, a light source assembly 200 is substantially same as a light source assembly of FIG. 1 except for that a plurality of light source is consecutively formed. Thus, any further detailed descriptions concerning the same elements will be omitted to avoid unnecessarily obscuring the present invention.

The light source assembly 200 may include a base substrate 210, a resin layer 220, a first light source 230a, a second light source 230b, a first fluorescence layer 240a, a second fluorescence layer 240b, a first transparent layer 250a, a second transparent 250b and a reflective layer 260.

The base substrate 210 may be an insulating substrate or a flexible printed circuit board. The base substrate 210 may include a metal pattern (not shown) disposed on the base substrate 210 to drive the first light source 230a and the second light source 230b. For example, the base substrate 210 may include polyimide resin, and a copper wiring on the base substrate 210 to drive the first light source 230a and the second light source 230b. In addition, the base substrate 210 may have a thickness of about 0.13 mm.

The resin layer 220 is disposed on the base substrate 210, and may include a first curved side surface 222a partially surrounding the first light source 230a and a second curved side surface 222b partially surrounding the second light source 230b. For example, the resin layer 220 may include a polyphthalamide resin (PPA) and a polycyclomethyleneterephthalate resin (PCT). The resin layer 220 is formed on the base substrate 210 except for where the first light source 230a and the second light source 230b are disposed. Thus, the first curved side surface 222a and the second curved side surface 222b surround sides of the first light source 230a and the second light source 230b except for light exiting surfaces of the first light source 230a and the second light source 230b, respectively. The resin layer 220 may include an opaque material to reflect the light from the first light source 230a and the second light source 230b.

The first light source 230a and the second light source 230b are disposed on the base substrate 210 adjacent each other, and electrically connected to the metal pattern formed on the base substrate 210. The first light source 230a and the second light source 230b generate light. Each of the first light source 230a and the second light source 230b may be a light emitting diode (LED) chip. For example, each of the first light source 230a and the second light source 230b may be an LED chip having a size about 500*500 (width*length)μm to about 1000*1000 μm. The each of the first light source 230a and the second light source 230b may be an LED chip having a size about 500*1000 μm. Faces formed by width*length of the first light source 230a and the second light source 230b are in parallel with the base substrate 210.

The first fluorescence layer 240a is disposed on the first light source 230a to cover the first light source 230a. The first fluorescence layer 240a may include a phosphor to improve a light efficiency of the first light source 230a. When the first light source 230a is a blue LED chip, the first fluorescence layer 240a may include a yellow phosphor. For example, the first fluorescence layer 240a may include a YAG:Ce ($T_3A_{15}O_{12}$:Ce) type phosphor such as a yttrium aluminum garnet doped with cerium or a silicate type yellow phosphor having a dominant wavelength of about 530~570 nm.

The second fluorescence layer 240b is disposed on the second light source 230b to cover the second light source 230b. The second fluorescence layer 240b may include a phosphor to improve a light efficiency of the second light source 230b. The second fluorescence layer 240b may include a material same as the first fluorescence layer 240a, and may have a shape same as the first fluorescence layer 240a.

The first transparent layer 250a is formed on the first fluorescence layer 240a to fill a space formed by the first curved side surface 222a of the resin layer 220 and the base substrate 210. For example, the first transparent layer 250a may be formed of a transparent silicon. The first transparent layer 250a may have a height greater than that of the resin layer 120, and may form a dome shape surrounded by the first light source 230a. Thus, the light from the first light source 230a may effectively exit through the light exit surface by the first reflective layer 260a on the first transparent layer 250a, so that the light efficiency may be improved. The first transparent layer 250a may have a height about 0.27 mm from an upper surface of the base substrate 210.

For example, the second transparent layer 250b may be formed on the second fluorescence layer 240b to fill a space formed by the second curved side surface 222b of the resin layer 220 and the base substrate 210. The second transparent layer 250b may include a material same as the first transparent layer 250a, and may have a shape same as the first transparent layer 250a.

The reflective layer 260 may be disposed on the first and second transparent layers 250a and 250b and the resin layer 220 to cover the first and second transparent layers 250a and 250b. The reflective layer 260 may include a material having relatively high light reflectance. Thus, the light from the first light source 230a and the second light source 230b reflects on the reflective layer 260 through the first fluorescence layers 240a and the second fluorescence layers and 240b and the first transparent layers 250a and the second transparent layers 250b, respectively, and efficiently exits through the light exiting surfaces. Thus, the light efficiency may be improved.

In the present exemplary embodiments, the light source assembly 200 may have a height of about 0.3 mm. Thus, the light source assembly 200 may have a relatively small height, and have a relatively large LED chips as a light source, so that the light efficiency may be improved.

FIGS. 4A to 4E are perspective views illustrating a method of manufacturing the light source assembly of FIG. 3.

Figure 4A:
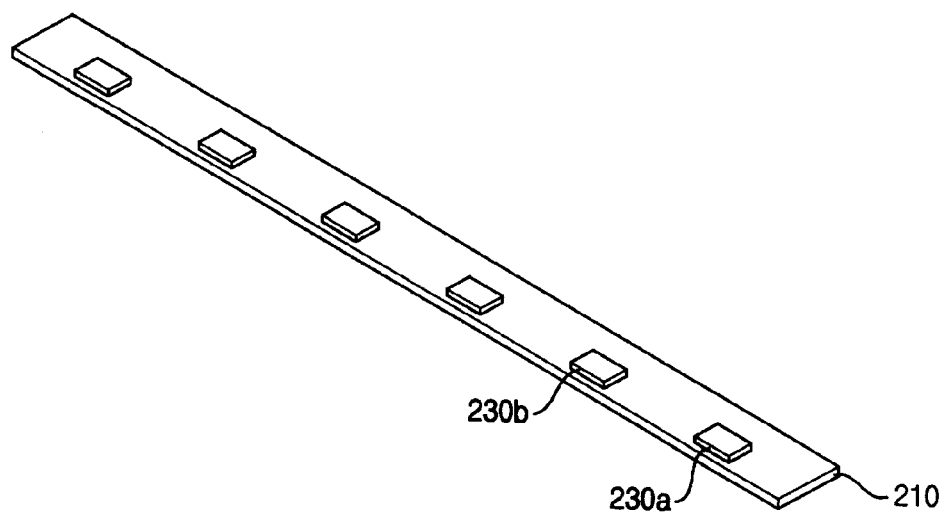
FIGS. 4A to 4E are perspective views illustrating a method of manufacturing the light source assembly of FIG. 3.

Referring to FIG. 4A, a plurality of light sources is mounted on a base substrate 210. For example, a first light source 230a and a second light source 230b adjacent the first light source 230a are arrayed in a length direction of the base substrate 210, and mounted on the base substrate 210. The base substrate 210 may include a metal pattern (not shown) disposed on the base substrate 210 to drive the first light source 230a and the second light source 230b. The first light source 230a and the second light source 230b are electrically connected to the metal pattern. The base substrate 210 may have a thickness of about 0.13 mm.

Each of the first light source 230a and the second light source 230b may be a light emitting diode (LED) chip. Each of the first light source 230a and the second light source 230b may be an LED chip having a size bigger than about 270*700 (width*length)μm. For example, each of the first light source 230a and the second light source 230b may be an LED chip having a size about 500*500 (width*length)μm to about 1000*1000 μm. The each of the first light source 230a and the second light source 230b may be an LED chip having a size about 500*1000 μm. The first light source 230a and the second light source 230b are mounted on the base substrate 210, as faces formed by width*length of the first light source 230a and the second light source 230b being in parallel with the base substrate 210.

Figure 4B:
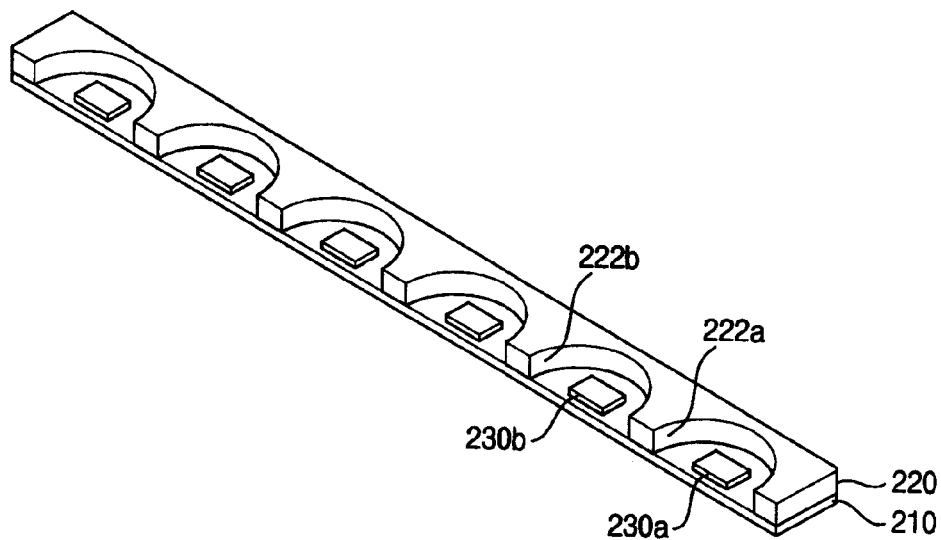

Referring to FIG. 4B, the resin layer 220 may be formed on the base substrate 210 on which the first light source 230a and the second light source 230b are mounted. The resin layer 220 may include a first curved side surface 222a partially surrounding the first light source 230a and a second curved side surface 222b partially surrounding the second light source 230b. Thus, the resin layer 220 is formed except for a portion where the first light source 230a and the second light source 230b are disposed. The resin layer 220 may include at least one of a polyphthalamide resin (PPA) and a polycyclomethyleneterephthalate resin (PCT).

Although the resin layer 220 is formed after the first light source 230a and the second light source 230b are mounted on the base substrate 210 in the present invention, the resin layer 220 may be formed before the first and second light sources 230a and 230b are mounted on the base substrate 210.

Figure 4C:
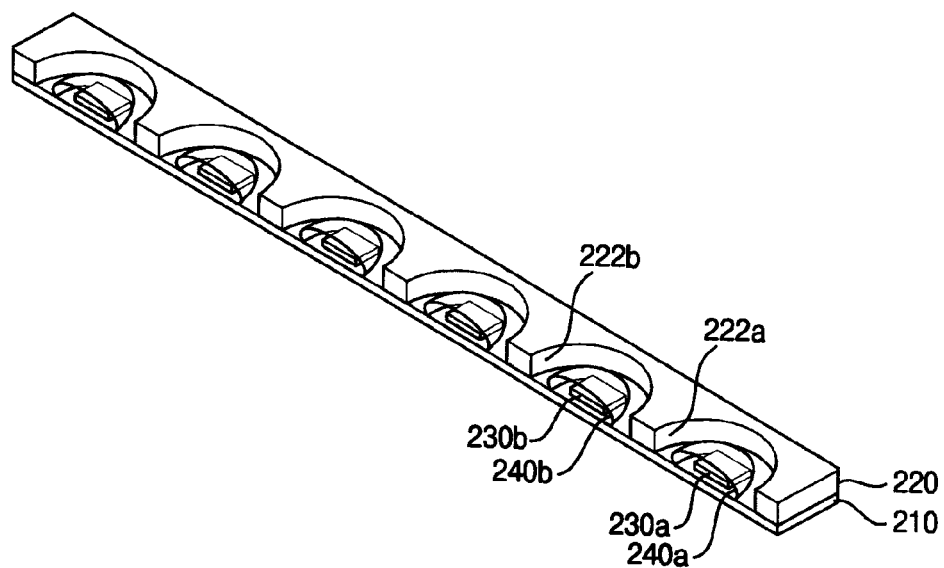

Referring to FIG. 4C, first fluorescence layer 240a and second fluorescence layer 240b including phosphor are formed on the first light source 230a and the second light source 230b, respectively. The first fluorescence layer 240a and the second fluorescence layer 240b may be formed in spaces, which is formed by the first curved side surface 222a and the second curved side surface 222b and the base substrate, to cover the first light source 230a and the second light source 230b, respectively.

When each of the first light source 230a and the second light source and 230b is a blue LED chip, the first fluorescence layer 240a and the second fluorescence layer 240b may include a yellow phosphor. For example, the first fluorescence layer 240a and the second fluorescence layer 240b may include a YAG:Ce($T_3A_{15}O_{12}$:Ce) type phosphor such as a yttrium aluminum garnet doped with cerium or a silicate type yellow phosphor having a dominant wavelength of about 530~570 nm.

Figure 4D:
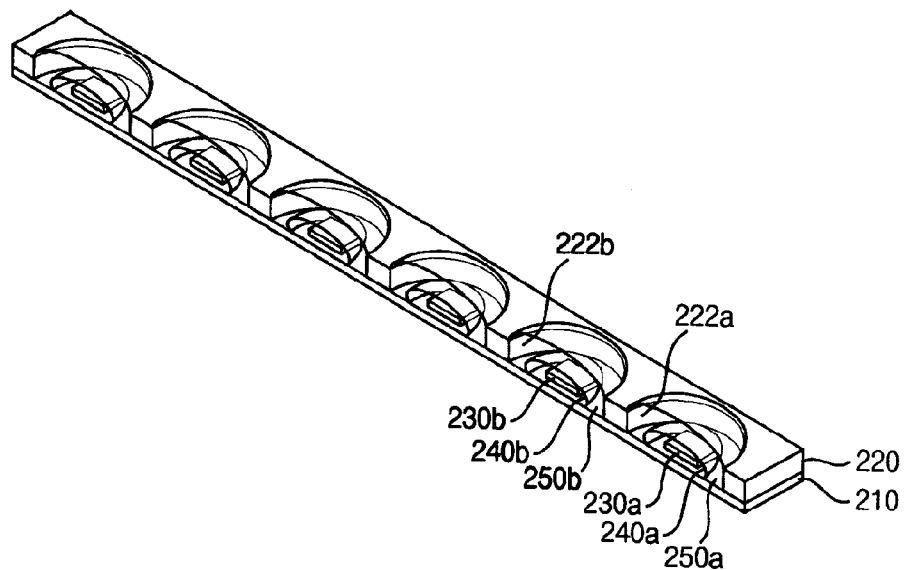

Referring to FIG. 4D, for example, the first transparent layer 250a and the second transparent layer 250b may be formed on the base substrate 210 on which the first fluorescence layer 240a and the second fluorescence layer 240b may be formed.

For example, the first transparent layer 250a and the second transparent layer 250b may be formed on the first fluorescence layer 240a and the second fluorescence layer 240b to fill spaces formed by the first curved side surface 222a and the second curved side surface 222b of the resin layer 220 and the base substrate 210, respectively. For example, the first transparent layer 250a and the second transparent layer 250b may be formed of a transparent silicon. The first transparent layer 250a and the second transparent layer 250b may have heights greater than that of the resin layer 220, and form dome shapes surrounded by the first second light source 230a and the second light source 230b, respectively. Each of the first transparent layers 250a and the second transparent layer 250b may have a height about 0.27 mm from an upper surface of the base substrate 210.

Figure 4E:
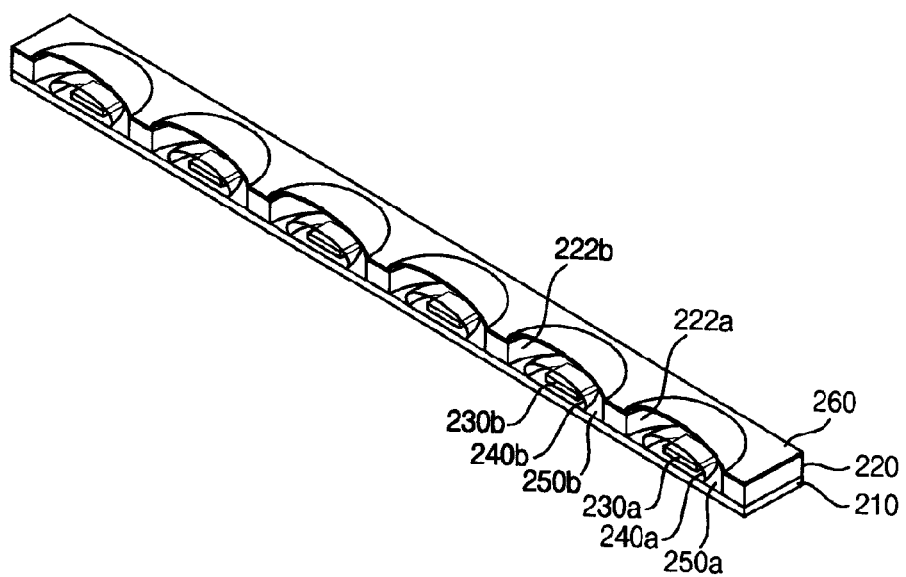

Referring to FIG. 4E, for example, the reflective layer 260 may be formed on the first transparent layer 250a and the second transparent layer 250b and the resin layer 220. The reflective layer 260 may include a material having relatively high light reflectance.

Figure 5:
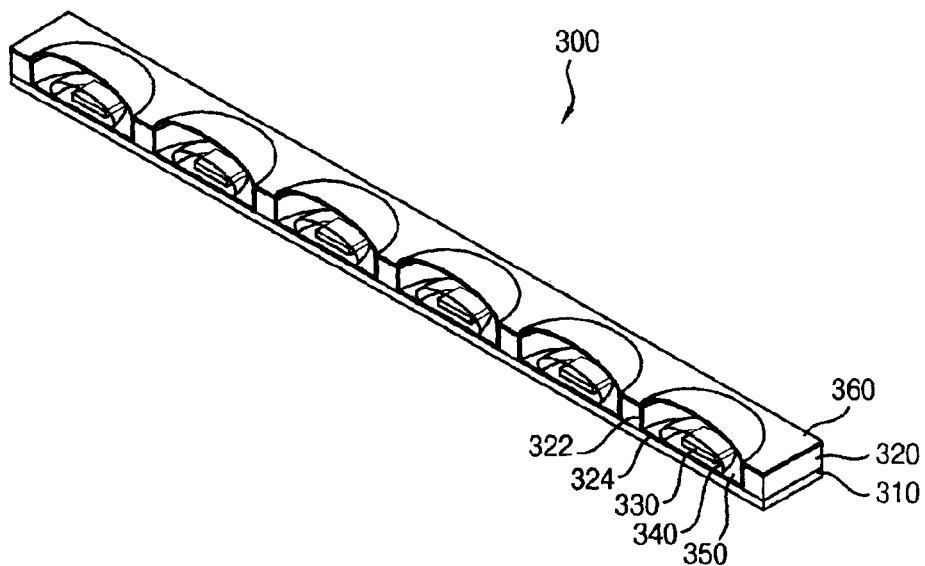
FIG. 5 is a perspective view illustrating a light source assembly according to exemplary embodiments of the invention.

FIG. 5 is a perspective view illustrating a light source assembly according to exemplary embodiments of the invention.

Referring to FIG. 5, a light source assembly 300 is substantially same as a light source assembly in FIG. 3, except for including a reflective film 324 disposed between a transparent layer 350 or a fluorescence layer 340 and a base substrate 310, or between the transparent layer 350 and a curved side surface 322 of a resin layer 320. Thus, any further detailed descriptions concerning the same elements will be omitted in order to avoid unnecessarily obscuring the present invention.

For example, the light source assembly 300 may include the base substrate 310, the resin layer 320, the reflective film 324, a light source 330, the fluorescence layer 340, the transparent layer 350 and a reflective layer 360.

The reflective film 324 may be formed between the curved side surface 322 of the resin layer 320 and the transparent layer 350. In addition, the reflective film 324 may be formed between a portion of the base substrate 310, which is exposed by the curved side surface 322 of the resin layer 320, and the fluorescence layer 340 or the transparent layer 350. Thus, light generated from the light source 330 is reflected on the portion of the base substrate 310, the curved side surface 322 or the reflective layer 360. The reflective film 324 may be formed on the portion of the base substrate 310 and the curved side surface 322 to improve light reflectance. The reflective film 324 may include a material having relatively high light reflectance.

Figure 6A:
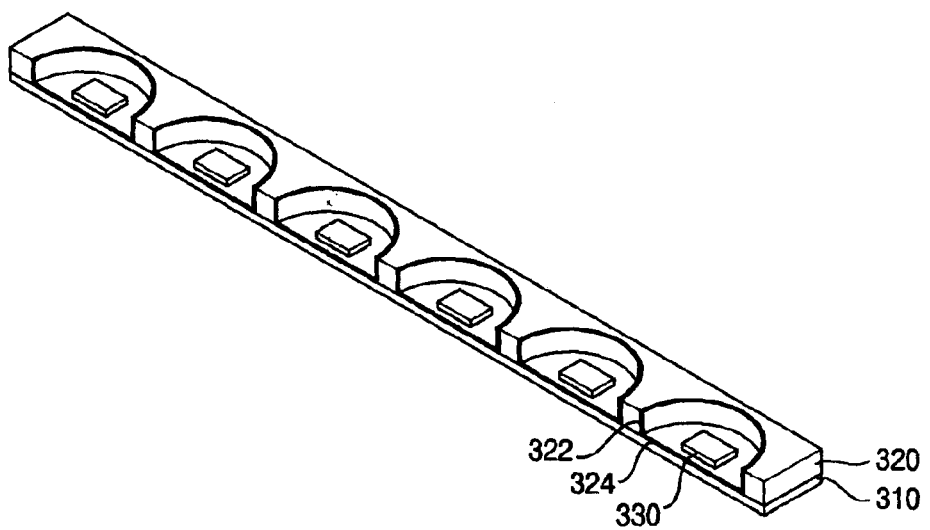
FIGS. 6A to 6B are perspective views illustrating a method of manufacturing the light source assembly of FIG. 5.
Figure 6B:
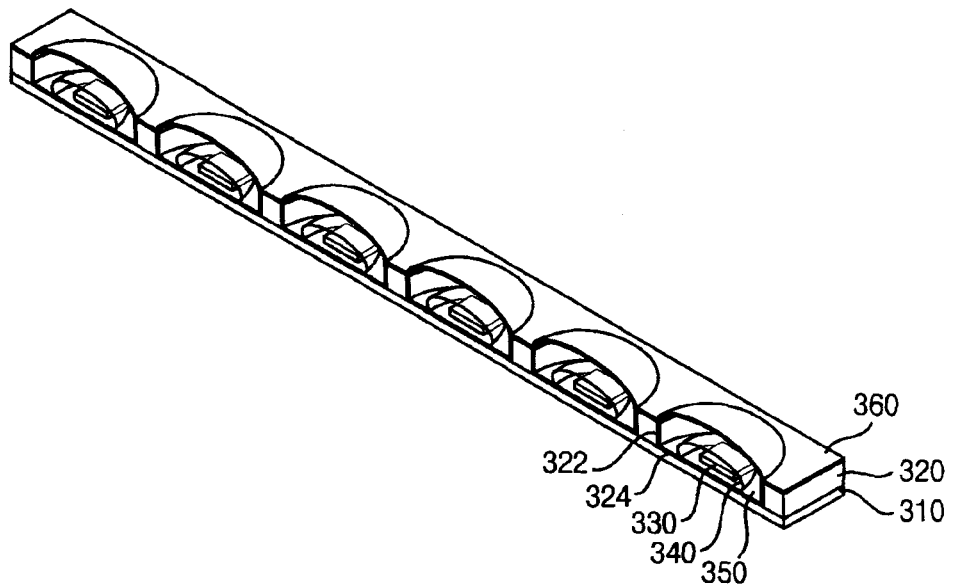

FIGS. 6A to 6B are perspective views illustrating a method of manufacturing the light source assembly of FIG. 5.

Referring to FIGS. 6A and 6B, a method of manufacturing the light source assembly is substantially same as a method of FIGS. 4A to 4E, except for forming a reflective film 324 between forming a resin layer 320 (compares to FIG. 4A) and forming fluorescence layer 340 (compares to FIG. 4C). Thus, any further detailed descriptions concerning the same elements will be omitted in order to avoid unnecessarily obscuring the present invention.

A light source 330 is mounted on a base substrate 310. The resin layer 320 may be formed on the base substrate 310 on which the light source 330 is mounted.

Referring again FIG. 6A, the reflective film 324 may be formed on a curved side surface 322 of the resin layer 320 and the base substrate 310. The reflective film 324 may have an opening corresponding to the light source 330. The reflective film 324 may be a reflective sheet having a film shape, or may be formed by coating a paint including a material having relatively high reflectivity.

Although the reflective film 324 is formed on the base substrate on which the light source 330 is formed based on the exemplary embodiments of the present invention, the reflective film 324 may be formed on the base substrate 310 before the light source 330 is mounted on the base substrate 310.

Referring to FIG. 6B, a fluorescence layer 340 and a transparent layer 350 are formed on the reflective film 324 and the light source 330. A reflective layer 360 may be formed on the transparent layer 350.

Figure 7:
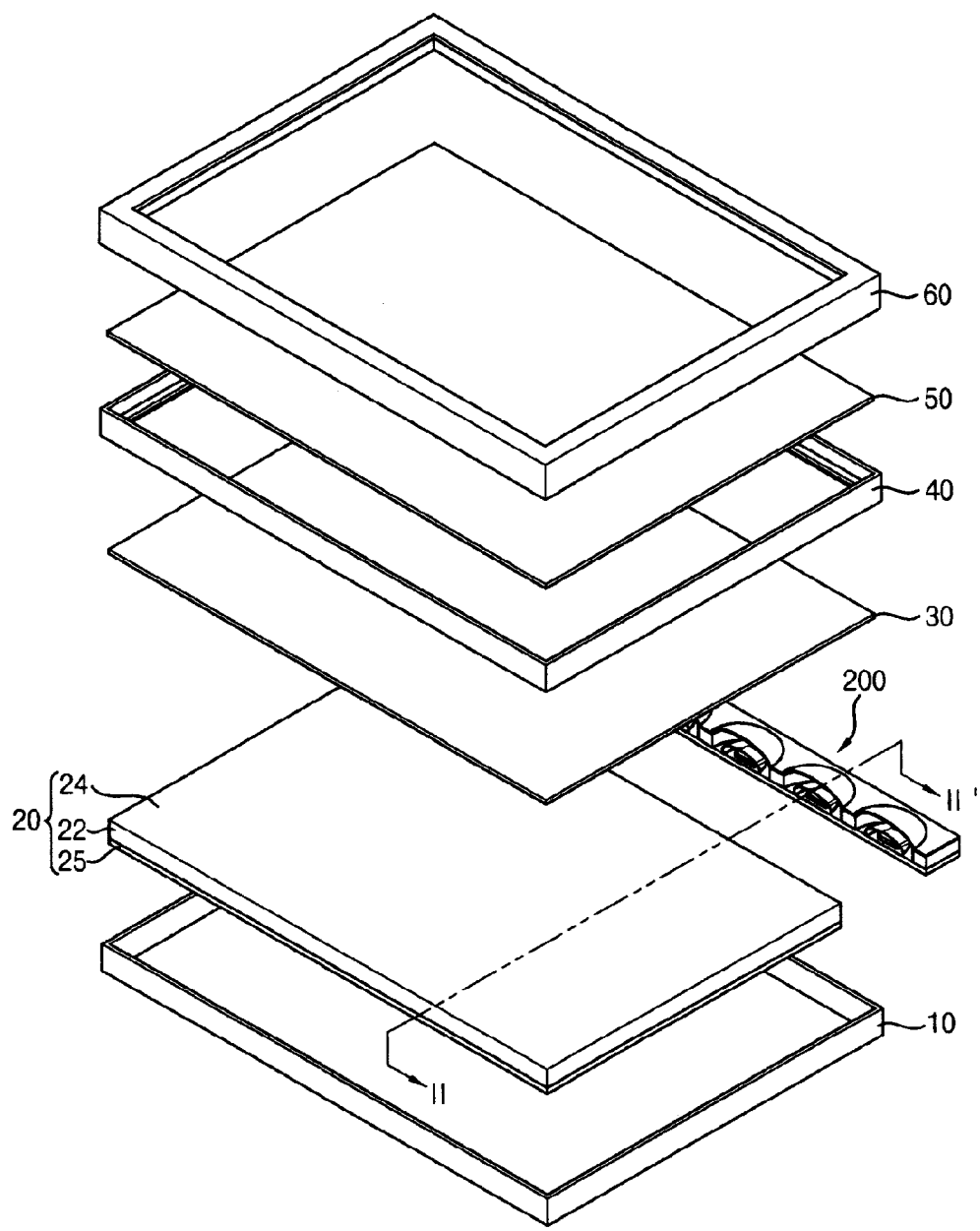
FIG. 7 is a perspective view illustrating a light source assembly according to exemplary embodiments of the invention.
Figure 8:
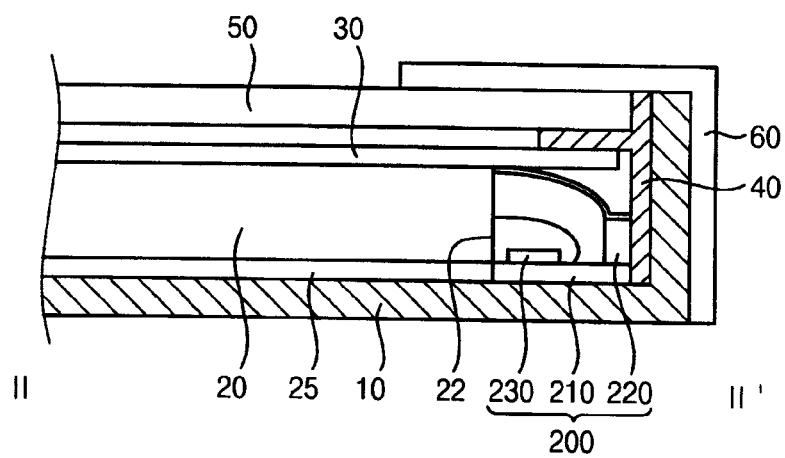
FIG. 8 is a cross-sectional view of the light source assembly taken along a line II-II' of FIG. 7.

FIG. 7 is a perspective view illustrating a light source assembly according to exemplary embodiments of the invention. FIG. 8 is a cross-sectional view of the light source assembly taken along a line II-II' of FIG. 7.

Referring to FIGS. 7 and 8, for example, a display apparatus may include a lower container 10, a light guiding plate 20, a light source assembly 200, an optical element 30, a mold frame 40, a display panel 50 and an upper container 60.

The lower container 10 and the upper container 60 receive the light guiding plate 20, the light source assembly 200, the optical element 30, the mold frame 40 and the display panel 50.

The mold frame 40 supports the display panel 50, the optical element 30, the light guiding plate 20 and the light source assembly 200 to fix them in the lower container 10 and the upper container 60.

The light guiding plate 20 is received in the lower container 10. The light guiding plate 20 may include a light incident surface 22 facing the light source assembly 200 and a light exiting surface 24 facing the display panel 50.

The light source assembly 200 is substantially same as a light source assembly 200 in FIG. 3. A light exiting surface of the light source assembly 200 faces the light incident surface 22 of the light guiding plate 20. The light source assembly 200 may have a height of about 0.3 mm. The height of the light source assembly 200 may be substantially same as a thickness of the light guiding plate 20.

Thus, although the light guiding plate 20 is thin as having the thickness of about 0.3 mm, the display apparatus may include the light source assembly 200, which has the height same as a thickness of the light guiding plate 20, and has the light source having relatively large LED chip, so that total thickness of the display apparatus may be decreased.

In addition, the display apparatus may further include an adhesive layer 25 disposed between the light guiding plate 20 and the lower container 10 to attach the light guiding plate 20 to the lower container 10.

Figure 9:
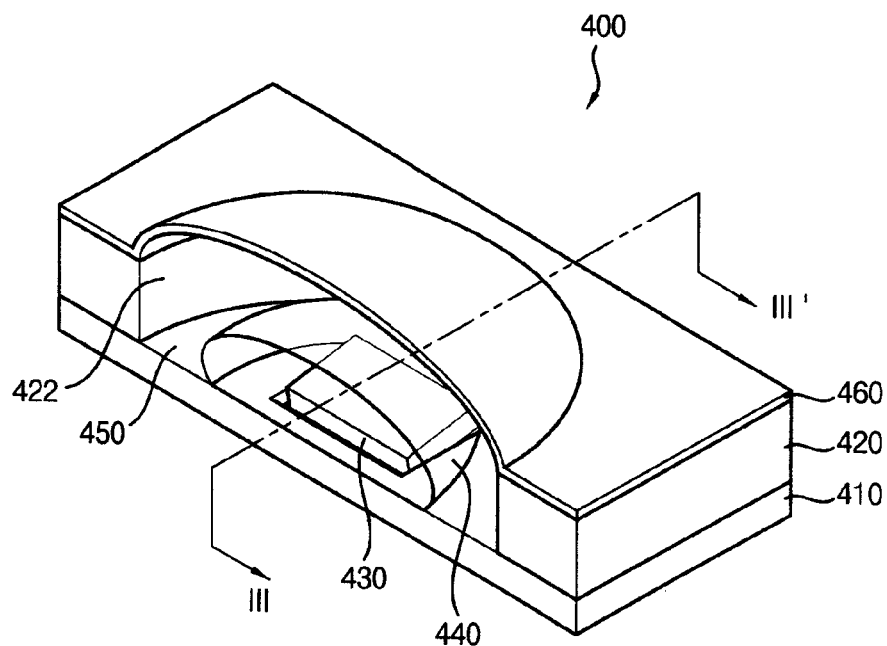
FIG. 9 is a perspective view illustrating a light source assembly according to exemplary embodiments of the invention.
Figure 10:
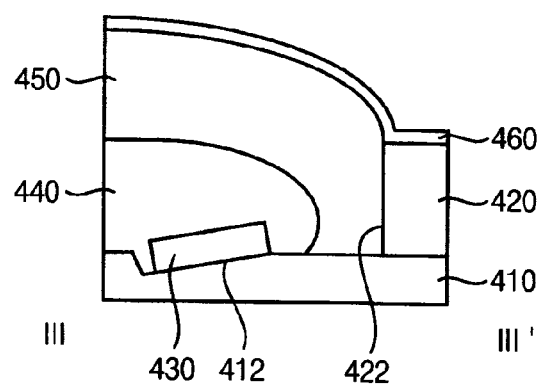
FIG. 10 is a cross-sectional view of the light source assembly taken along a line III-III' of FIG. 9.

FIG. 9 is a perspective view illustrating a light source assembly according to exemplary embodiments of the invention. FIG. 10 is a cross-sectional view of the light source assembly taken along a line III-III' of FIG. 9.

Referring to FIGS. 9 and 10, for example, a light source assembly 400 may include a base substrate 410, a resin layer 420, a light source 430, a fluorescence layer 440, a transparent layer 450 and a reflective layer 460.

The base substrate 410 may be an insulating substrate or a flexible printed circuit board. The base substrate 410 may include a metal pattern (not shown) disposed on the base substrate 410 to drive the light source 430. For example, the base substrate 410 may include polyimide resin, and a copper wiring on the base substrate 410 to drive the light source 430. In addition, the base substrate 410 may have a thickness of about 0.13 mm.

The base substrate 410 may have a recess 412 to tilt the light source 430 by a predetermined angle. Thus, the light source 430 is slanted toward a light exiting surface through which light exits. The recess 412 is formed by depression of an upper surface of a portion of the base substrate 410. Detailed explanation about shapes and manufacturing methods of the base substrate 410 will be explained in FIGS. 11A to 12B.

For example, the resin layer 420 may be disposed on the base substrate 410, and may include a curved side surface 422 partially surrounding the light source 430. The resin layer 420 may include, for example, a polyphthalamide resin (PPA) and a polycyclomethyleneterephthalate resin (PCT). The resin layer 420 is formed on the base substrate 410 expect for where the light source 430 is disposed. Thus, the curved side surface 422 surrounds sides of the light source 430 except for a light exiting surface which light from the light source 430 exits. The resin layer 420 may include an opaque material to reflect the light from the light source 430.

The light source 430 may be disposed in the recess 412 of the base substrate 410, and electrically connected to the metal pattern formed on the base substrate 410. The light source 430 is tilted with respect to the upper surface of the base substrate 410. The light source 430 generates light. The light source 430 may be a light emitting diode (LED) chip. The light source 430 may be an LED chip having a size bigger than about 270*700 (width*length)μm. For example, the light source 130 may be an LED chip having a size about 500*500 μm to about 1000*1000 μm. In an exemplary embodiment, the light source 130 may be an LED chip having a size about 500*1000 μm. A face formed by width*length of the light source is inclined by a predetermined angle with respect to the upper surface of the base substrate 410.

The fluorescence layer 440 is disposed on the light source 430 to cover the light source 430. The fluorescence layer 440 may include a phosphor to improve a light efficiency of the light source 430. When the light source 430 is a blue LED chip, the fluorescence layer 440 may include a yellow phosphor. For example, the fluorescence layer 440 may include a YAG:Ce($T_3A_{15}O_{12}$:Ce) type phosphor such as a yttrium aluminum garnet doped with cerium or a silicate type yellow phosphor having a dominant wavelength of about 530~570 nm.

The transparent layer 450 is formed on the fluorescence layer 440 to fill a space formed by the curved side surface 422 of the resin layer 420 and the base substrate 410. For example, the transparent layer 450 may be formed of a transparent silicon. The transparent layer 450 may have a height greater than that of the resin layer 420, and form a dome shape surrounded by the light source 430. Thus, the light from the light source 430 may effectively exit through the light exit surface by the reflective layer 460 on the transparent layer 450, so that the light efficiency may be improved. The transparent layer 450 may have a height about 0.27 mm from an upper surface of the base substrate 410.

The reflective layer 460 may be disposed on the transparent layer 450 and the resin layer 420 to cover the transparent layer 450. The reflective layer 460 may include a material having relatively high light reflectance. Thus, the light from the light source 430 reflects on the reflective layer 460 through the fluorescence layer 440 and the transparent layer 450, and efficiently exits through the light exiting surface. Thus, the light efficiency may be improved.

In the exemplary embodiments of the present invention, the light source assembly 400 may have a height of about 0.3 mm. Thus, the light source assembly 400 may have a relatively small height, and have a relatively large LED chips as a light source, so that the light efficiency may be improved.

In addition, the light source 430 may be disposed in the recess 412 of the base substrate 410, so that the light source 430 is slanted toward the light exiting surface through which the light exits. Thus, the light efficiency may be improved.

Figure 11A:
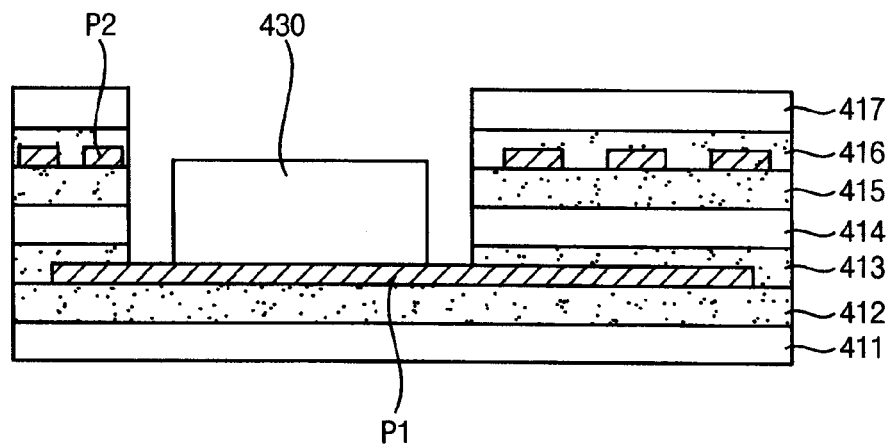
FIGS. 11A to 11C are cross-sectional views illustrating various example embodiments of a base substrate and a light source of the light source assembly of FIG. 8.
Figure 11B:
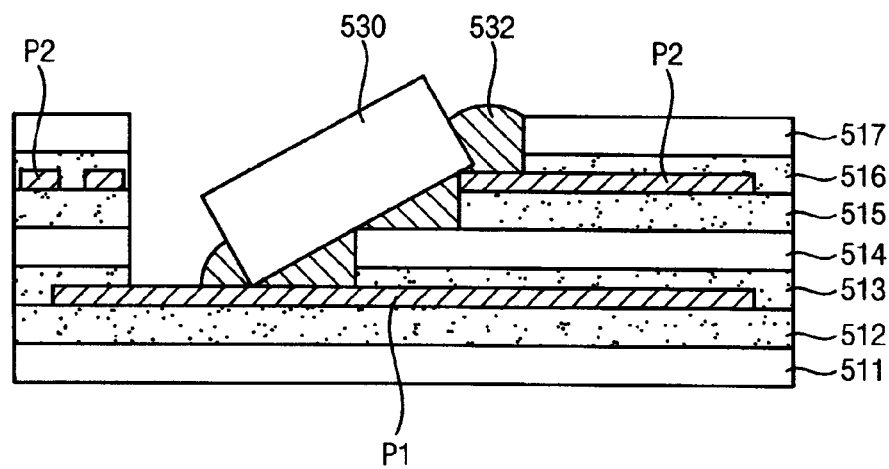
Figure 11C:
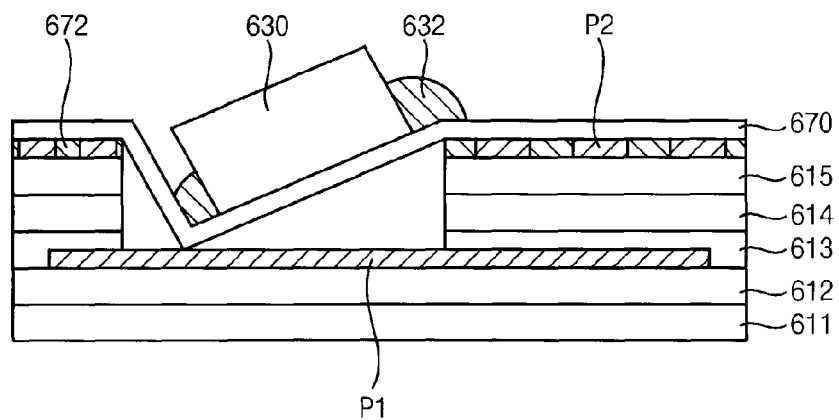

FIGS. 11A to 11C are cross-sectional views illustrating various exemplary embodiments of a base substrate and a light source of the light source assembly of FIG. 8.

Referring to FIG. 11A, for example, a base substrate may include a first insulation layer 411, a first adhesive layer 412, a first metal pattern P1, a second adhesive layer 413, a second insulation layer 414, a third adhesive layer 415, a second metal pattern P2, a fourth adhesive layer 416, and a third insulation layer 417.

The first adhesive layer 412 may be disposed on the first insulation layer 411. The first insulation layer 411 may be a polyimide film. The first adhesive layer 412 may include an adhesive. The first metal pattern P1 may be formed on the first adhesive layer 412. The first metal pattern P1 may be a circuit wiring to drive a light source 430.

The second adhesive layer 413 may be formed on the first adhesive layer 412 on which the first metal pattern P1 is formed. The second adhesive layer 413 may include an adhesive. The second adhesive layer 413 may have an opening corresponding to the light source 430 to expose a portion of the first metal pattern P1.

The light source 430 may be disposed on the portion of the first metal pattern which is exposed. The light source 430 is electrically connected to the first metal pattern P1.

The second insulation layer 414 may be disposed on the second adhesive layer 413. The second insulation layer 414 may be a polyimide film.

The third adhesive layer 415 may be disposed on the second insulation layer 414. The third adhesive layer 415 may include an adhesive. The second metal pattern P2 may be formed on the third adhesive layer 415. The second metal pattern P2 may consist of the circuit wiring to drive the light source 430 with the first metal pattern P1.

The fourth adhesive layer 416 may be disposed on the third adhesive layer 415 on which the second metal pattern P2 is formed on the third adhesive layer 415. The fourth adhesive layer 416 may include an adhesive.

The third insulation layer 417 may be disposed on the fourth adhesive layer 416. The third insulation layer 417 may be a polyimide film.

The second adhesive layer 413, the second insulation layer 414, the third adhesive layer 415, the fourth adhesive layer 416 and the third insulation layer 417 may have the opening corresponding to the light source 430, so that a recess (refers to 412 of FIG. 10) on which the light source 430 is disposed may be formed.

Referring to FIG. 11B, a base substrate and a light source are substantially same as a base substrate and a light source of FIG. 11A, expect for an adhesive element 532 and except for that a recess is slantly formed. Thus, any further detailed descriptions concerning the same elements will be omitted in order to avoid unnecessarily obscuring the present invention.

For example, the base substrate may include a first insulation layer 511, a first adhesive layer 512, a first metal pattern P1, a second adhesive layer 513, a second insulation layer 514, a third adhesive layer 515, a second metal pattern P2, a fourth adhesive layer 516, and a third insulation layer 517.

The first adhesive layer 512 may be disposed on the first insulation layer 511. The first insulation layer 511 may be a polyimide film. The first adhesive layer 512 may include an adhesive. The first metal pattern P1 may be formed on the first adhesive layer 512. The first metal pattern P1 may be a circuit wiring to drive a light source 530.

The second adhesive layer 513 may be formed on the first adhesive layer 512 on which the first metal pattern P1 may be formed. The second adhesive layer 513 may include an adhesive. The second insulation layer 514 may be disposed on the second adhesive layer 513. The second insulation layer 514 may be a polyimide film.

The second adhesive layer 513 and the second insulation layer 514 may have a first opening exposing a portion of the first metal pattern P1 where the light source 530 may be disposed.

The third adhesive layer 515 may be disposed on the second insulation layer 514. The third adhesive layer 515 may include an adhesive. The third adhesive layer 515 may have a second opening bigger than the first opening where the light source 530 may be disposed.

The second metal pattern P2 may be formed on the third adhesive layer 515. The second metal pattern P2 may consist of the circuit wiring to drive the light source 530 with the first metal pattern P1.

The fourth adhesive layer 516 may be disposed on the third adhesive layer 515 on which the second metal pattern P2 may be formed on the third adhesive layer 515. The fourth adhesive layer 516 may include an adhesive. The third insulation layer 517 may be disposed on the fourth adhesive layer 516. The third insulation layer 517 may be a polyimide film. The fourth adhesive layer 516 and the third insulation layer 517 may have a third opening bigger than the second opening where the light source 530 may be disposed.

Thus, the second adhesive layer 513, the second insulation layer 514, the third adhesive layer 515, the fourth adhesive layer 516 and the third insulation layer 517 may have the first to third openings, so that a slanted recess (refers to 412 of FIG. 10) on which the light source 530 is disposed is formed. The light source 530 may be disposed in the first to third openings, and electrically connected to the second metal pattern P2. The light source 530 may be fixed on the base substrate by the adhesive element 532. The adhesive element 532 may be an epoxy adhesive.

Referring to FIG. 11C, a bases substrate and a light source are substantially same as a base substrate and a light source of FIG. 11A, expect for a metal frame 670. Thus, any further detailed descriptions concerning the same elements will be omitted in order to avoid unnecessarily obscuring the present invention.

The base substrate may include a first insulation layer 611, a first adhesive layer 612, a first metal pattern P1, a second adhesive layer 613, a second insulation layer 614, a third adhesive layer 615, a second metal pattern P2, and the metal frame 670.

The first adhesive layer 612 may be disposed on the first insulation layer 611. The first insulation layer 611 may be a polyimide film. The first adhesive layer 612 may include an adhesive. The first metal pattern P1 may be formed on the first adhesive layer 612. The first metal pattern P1 may be a circuit wiring to drive a light source 630.

The second adhesive layer 613 may be formed on the first adhesive layer 612 on which the first metal pattern P1 is formed. The second adhesive layer 613 may include an adhesive. The second insulation layer 614 may be disposed on the second adhesive layer 613. The second insulation layer 614 may be a polyimide film. The third adhesive layer 615 may be disposed on the second insulation layer 614. The third adhesive layer 615 may include an adhesive.

The second adhesive layer 613, the second insulation layer 614, the third adhesive layer 615 may have an opening exposing a portion of the first metal pattern P1 where the light source 630 is disposed.

The second metal pattern P2 may be formed on the third adhesive layer 615. The second metal pattern P2 may consist of the circuit wiring to drive the light source 630 with the first metal pattern P1.

The metal frame 670 is disposed on the second metal pattern P2 to be electrically connected to the second metal pattern P2. For example, the metal frame 670 may be mounted on the second metal pattern via surface mount technology (SMT). In addition, the metal frame 670 may be attached by an adhesive element 672. The metal frame 670 may form a slanted surface to slantly place the light source 630 in the opening. Thus, metal frame 670 may form a slanted recess (refers to 412 of FIG. 10) in which the light source 630 is disposed. The light source 630 may be disposed on the slanted surface, and attached by an adhesive element 632. The adhesive element 632 and 672 may be an epoxy adhesive.

Figure 12A:
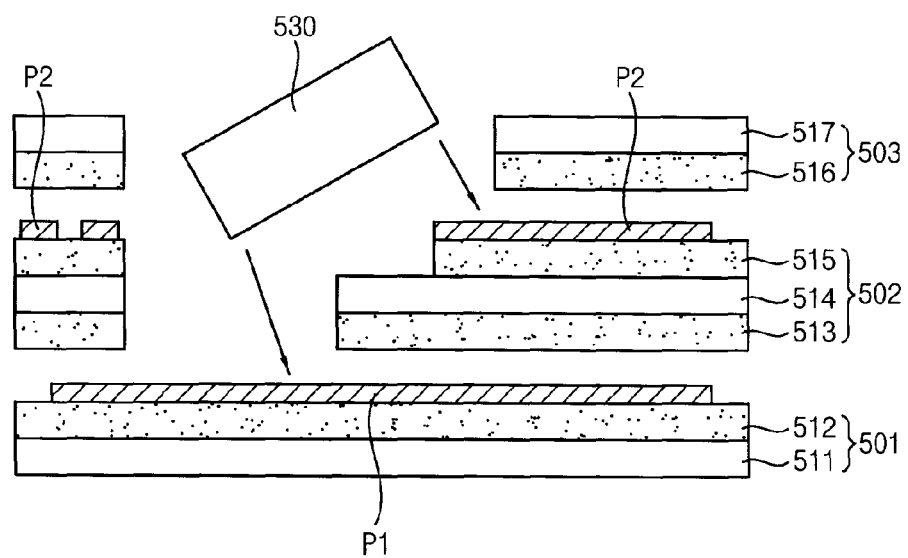
FIGS. 12A to 12B are cross-sectional views illustrating a method of manufacturing the base substrate and the light source of FIG. 11B.
Figure 12B:
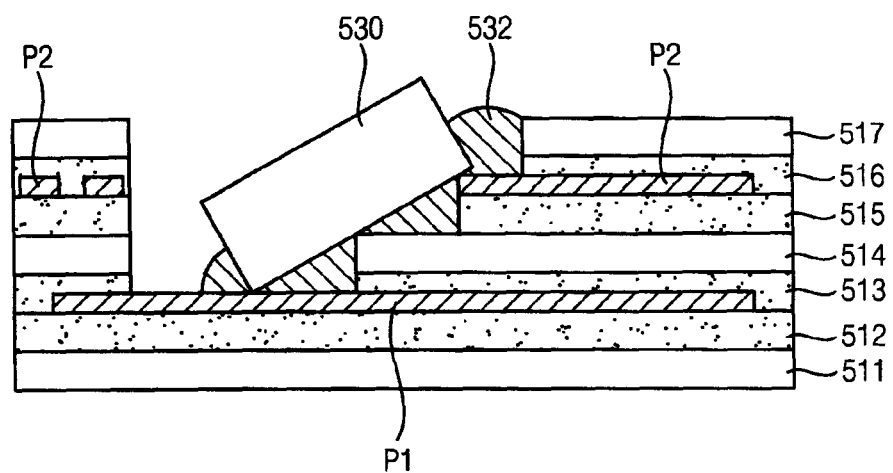

FIGS. 12A to 12B are cross-sectional views illustrating a method of manufacturing the base substrate and the light source of FIG. 11B.

Referring to FIGS. 12A to 12B, a method of manufacturing a base substrate and a light source includes providing a first substrate 501, a second substrate 502 and a third substrate 503, attaching the first substrate 501, the second substrate 502 and the third substrate 503 by pressing, and disposing a light source 530 on the base substrate.

In a step of providing the first substrate 501, the second substrate 502 and the third substrate 503, the second substrate 502 may be disposed on the first substrate 501 and the third substrate 503 may be disposed on the second substrate 502, sequentially.

The first substrate 501 may include a first insulation layer 511, a first adhesive layer 512 and a first metal pattern P1. The first adhesive layer 512 may be formed on the first insulation layer 511. The first insulation layer 511 may be a polyimide film. The first adhesive layer 512 may include an adhesive. The first metal pattern P1 may be formed on the first adhesive layer 512. The first metal pattern P1 may consist of a circuit wiring to drive a light source 530.

The second substrate 502 may include a second adhesive layer 513, a second insulation layer 514, a third adhesive layer 515, and a second metal pattern P2. The second adhesive layer 513 may be formed under the second insulation layer 514. The third adhesive layer 515 may be formed on the second insulation layer 514. The second metal pattern P2 may be formed on the third adhesive layer 515.

A first opening may be formed through the second substrate 502 in which the light source 530 is disposed. The first opening is formed by removing a portion of the second substrate 502. A stepped portion, on which the light source 530 is slantly disposed, is formed by removing a portion of the third adhesive layer 515. (refers to second opening of FIG. 11B) The removed portion of the second substrate may be formed via a mold punching, a laser punching, or etching process.

The third substrate 503 may include a fourth adhesive layer 516 and a third insulation layer 517. The third opening bigger than the first opening, where the light source 530 is disposed, may be formed through the third substrate 503.

In a step of attaching the first substrate 501, the second substrate 502 and the third substrate 503 by pressing, the base substrate may be formed by pressing the first substrate 501, the second substrate 502 and the third substrate 503 which are arrayed one after another.

In a step of disposing the light source 530 on the base substrate, the light source 530 may be disposed in the first and third openings. The second adhesive layer 513, the second insulation layer 514, the third adhesive layer 515, the fourth adhesive layer 516 and the third insulation layer 517 may form a slanted recess (refers to 412 of FIG. 10). The light source 530 is slantly disposed in the first and third openings, and electrically connected to the first and second metal pattern P1 and P2. The light source 530 may be fixed on the base substrate by the adhesive element 532. The adhesive element 532 may be an epoxy adhesive.

Figure 13:
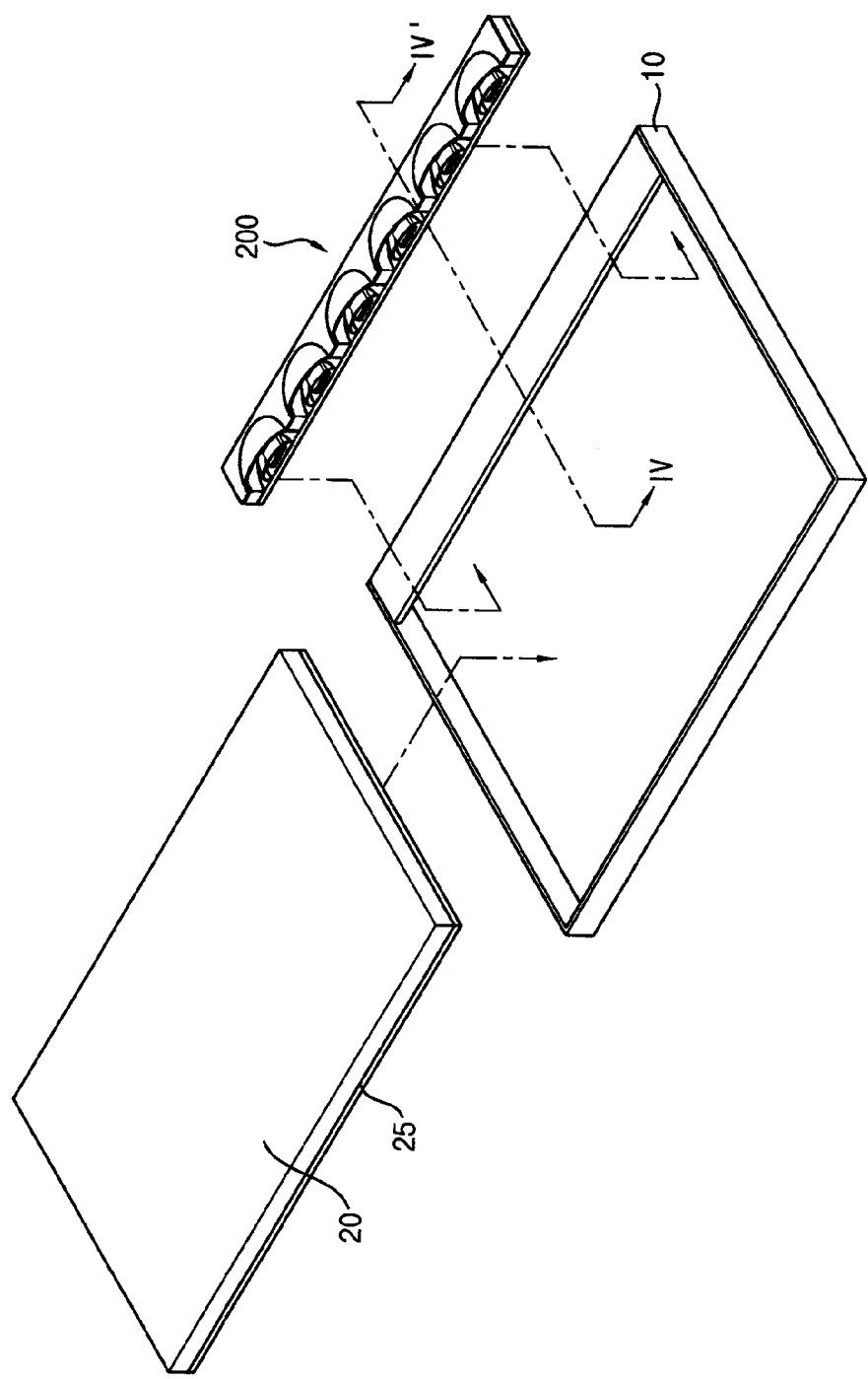
FIG. 13 is a perspective view illustrating a backlight assembly according to exemplary embodiments of the invention.
Figure 14:
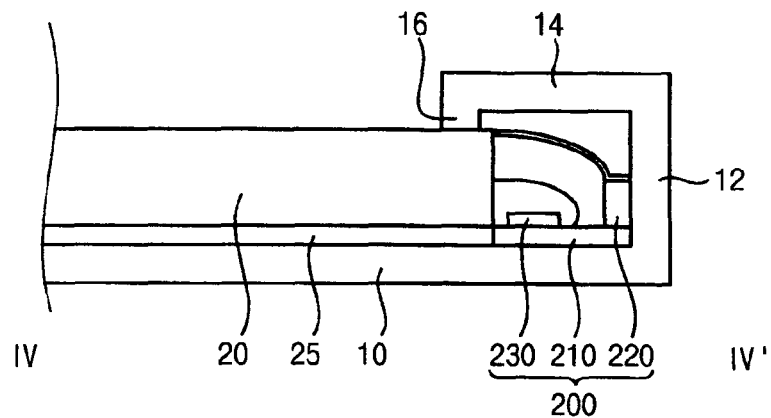
FIG. 14 is a cross-sectional view of the light source assembly taken along a line IV-IV' of FIG. 7.

FIG. 13 is a perspective view illustrating a backlight assembly according to exemplary embodiments of the invention. FIG. 14 is a cross-sectional view of the light source assembly taken along a line IV-IV' of FIG. 7.

Referring to FIGS. 13 and 14, a backlight assembly may include a container 10, a light guiding plate 20 and a light source assembly 200. The light guiding plate 20 and the light source assembly 200 are substantially same as a light guiding plate and a light source assembly of FIG. 7. Thus, any further detailed descriptions concerning the same elements will be omitted in order to avoid unnecessarily obscuring the present invention.

The container 10 receives the light guiding plate 20 and the light source assembly 200. The container 10 may include a side wall 12, a first light source cover portion 14 and a second light source cover portion 16. The side wall 12 extends from a bottom plate of the container 10 and perpendicular to the bottom plate. The first light source cover portion 14 extends from the side wall 12 in parallel with the bottom plate, and forms over the light source assembly 200 to cover the light source assembly 200. The first light source cover portion 14 partially covers the light guiding plate 20.

The second light source cover portion 16 extends from the first light source cover portion 14 toward the light guiding plate 20. The second light source cover portion 16 may be substantially perpendicular to the first light source cover portion 14. The second light source cover portion 16 prevents light of the light source assembly 200 from exiting between the container 10 and the light guiding plate 20. Inside surfaces of the first light source cover portion 14, the second light source cover portion 16 and the side wall 12 may include a material having relatively high light reflectivity. For example, a reflective film (not shown) may be coated on the inside surfaces.

The light source assembly 200 generates light. The light guiding plate 20 guides the light from the light source assembly 200. The light guiding plate 20 may further include an adhesive layer 25 disposed under the light guiding plate 20 to attach and fix the light guiding plate 20 on the container 10.

Thus, although a thickness of the light source assembly 200 is smaller than a height of a space formed by the side wall 12 and the first light source cover portion 14 of the container 10, light leaking from an upper portion of the light guiding plate 20 may be blocked by or reflected on the second light source cover portion, so that the light efficiency may be improved.

Figure 15:
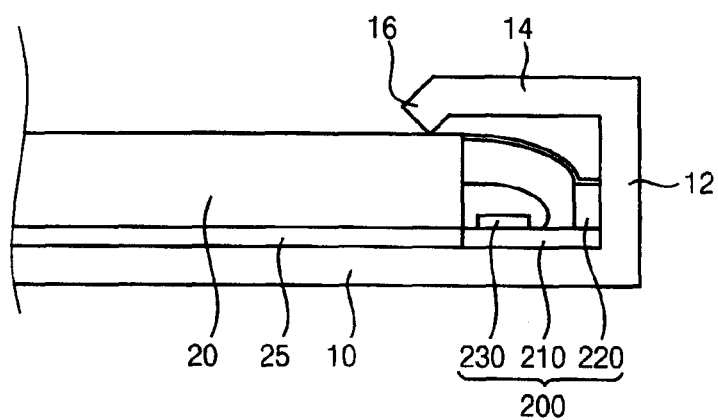
FIG. 15 is a cross-sectional view of the light source assembly according to exemplary embodiments of the invention.

FIG. 15 is a cross-sectional view of the light source assembly according to exemplary embodiments of the invention.

Referring to FIG. 15, a backlight assembly is substantially same as a backlight assembly of FIG. 14, except for a second light source cover portion 16a. Thus, any further detailed descriptions concerning the same elements will be omitted in order to avoid unnecessarily obscuring the present invention.

The second light source cover portion 16a extends from a first light source cover portion 14 toward the light guiding plate 20. The second light source cover portion 16a may slanted with respect to the first light source cover portion 14 by a predetermined angle. For example, the second light source cover portion 16 and the first light source cover portion 14 may make an angle of about 90 degree to 180 degree. The second light source cover portion 16 prevents light of the light source assembly 200 from exiting between the container 10 and the light guiding plate 20. Inside surfaces of the first light source cover portion 14, the second light source cover portion 16 and the side wall 12 may include a material having relatively high light reflectivity. For example, a reflective film (not shown) may be coated on the inside surfaces.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light source assembly, comprising:
   a base substrate;
   a resin layer disposed on the base substrate without completely covering the base substrate such that a portion of the base substrate is exposed; and
   a first light source disposed on the exposed portion, the first light source comprising a hexahedron shape, and the first light source comprising a smaller height than a length or a width of a face of the first light source disposed parallel with the base substrate.

2. The light source assembly of claim 1, wherein the resin layer comprises a curved side surface partially surrounding the first light source.

3. The light source assembly of claim 2, further comprising:
   a transparent layer, the transparent layer covering the first light source and being disposed in a space defined by the exposed portion and the curved side surface.

4. The light source assembly of claim 3, wherein a height of the transparent layer is greater than a height of the resin layer with respect to an upper surface of the base substrate, and the transparent layer comprises a dome shape.

5. The light source assembly of claim 4, further comprising:
   a fluorescence layer disposed between the transparent layer and the first light source, the fluorescence layer comprising a phosphor.

6. The light source assembly of claim 3, further comprising:
   a reflective layer disposed on the transparent layer.

7. The light source assembly of claim 3, further comprising:
a reflective film disposed between the transparent layer and the base substrate, and between the transparent layer and the curved side surface of the resin layer.

8. The light source assembly of claim 3, wherein a height from an upper surface of the base substrate to an uppermost portion of the transparent layer is less than about 0.3 mm.

9. The light source assembly of claim 1, wherein the first light source comprises a light emitting diode (LED) chip having a size about 500*500 μm to about 1000*1000 μm (width*length of the face in parallel with the base substrate).

10. The light source assembly of claim 1, further comprising:
a second light source disposed on another portion of the base substrate that is exposed by the resin layer, the second light source being adjacent to the first light source.

11. The light source assembly of claim 1, wherein:
the base substrate comprises a recess;
the first light source is disposed in the recess; and
the face of the first light source in parallel with the base substrate is slanted with respect to the base substrate.

12. The light source assembly of claim 11, wherein the base substrate comprises:
a first substrate comprising a first insulation layer, a first adhesive layer disposed on the first insulation layer, and a first metal pattern disposed on the a first adhesive layer;
a second substrate comprising a second adhesive layer disposed on the first metal pattern and the first adhesive, a second insulation layer disposed on the second adhesive layer, a third adhesive layer disposed on the second insulation layer, and a second metal pattern disposed on the third adhesive layer; and
a third substrate comprising a fourth adhesive layer disposed on the third adhesive layer, and a third insulation layer disposed on the fourth adhesive layer,
wherein the second adhesive layer and the second insulation layer have a first opening where the first light source is disposed, the first opening exposes a portion of the first metal pattern,
wherein the third adhesive layer comprises a second opening bigger than the first opening where the first light source is disposed,
wherein the fourth adhesive layer and the third insulation layer comprise a third opening bigger than the second opening where the first light source is disposed, and
wherein the recess is formed by the first opening, the second opening or the third opening and the first substrate.

13. The light source assembly of claim 11, further comprising:
a metal frame disposed on the base substrate, the metal frame comprising the recess.

14. A display apparatus, comprising:
a display panel;
a light source assembly comprising:
a base substrate;
a resin layer disposed on the base substrate without completely covering the base substrate such that a portion of the base substrate is exposed; and
a first light source disposed on the exposed portion, the first light source comprising a hexahedron shape, and the first light source comprising a smaller height than a length or a width of a face of the first light source disposed parallel with the base substrate;
a light guiding plate configured to guide light from the light source assembly to the display panel; and
a receiving container configured to receive the display panel, the light source assembly and the light guiding plate.

15. The display apparatus of claim 14, wherein the receiving container comprises:
a bottom plate;
a side wall substantially perpendicular to the bottom plate;
a first light source cover portion disposed over the light source assembly and a portion of the light guiding plate, the first light source cover portion extending from the side wall and parallel with the bottom plate; and
a second light source cover portion extending from the first light source cover portion toward the bottom plate.

16. The display apparatus of claim 15, wherein the first light source cover portion and the second light source cover portion comprise an angle of about 90 degree to 180 degree.

17. The display apparatus of claim 15, wherein a thickness of the light guiding plate is less than about 0.3 mm, and a height of the light source assembly is substantially same as the thickness of the light guiding plate.

18. A method of manufacturing a light source assembly, comprising:
forming a base substrate;
forming a resin layer on the base substrate to expose a portion of the base substrate;
disposing a first light source comprising a face disposed in parallel with the base substrate on the exposed portion, the first light source comprising a hexahedron shape, and a height smaller than a length or a width of the face;
forming a fluorescence layer on the first light source;
forming a transparent layer on the base substrate on which the fluorescence layer is formed; and
forming a reflective layer on the transparent layer, the reflective layer comprising a material having relatively high light reflectance.

19. The method of claim 18, wherein forming the base substrate comprises forming a recess on the base substrate, wherein the first light source is slanted.

20. The method of claim 19, wherein forming the recess comprises:
disposing a first substrate, a second substrate and a third substrate;
forming a first opening through the second substrate;
forming a second opening through the third substrate, the second opening bigger than the first opening and corresponding to the first opening; and
sequentially attaching the first substrate, the second substrate and the third substrate by pressing.

* * * * *